United States Patent
Shi et al.

(10) Patent No.: US 10,121,442 B2
(45) Date of Patent: Nov. 6, 2018

(54) DRIVING METHODS AND DRIVING DEVICES OF GATE DRIVER ON ARRAY (GOA) CIRCUIT

(71) Applicant: Shenzhen China Star Optoelectronics Technology Co., Ltd., Shenzhen, Guangdong (CN)

(72) Inventors: Longqiang Shi, Guangdong (CN); Shu Jhih Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 115 days.

(21) Appl. No.: 15/328,629

(22) PCT Filed: Jan. 17, 2017

(86) PCT No.: PCT/CN2017/071330
§ 371 (c)(1),
(2) Date: Jan. 24, 2017

(87) PCT Pub. No.: WO2018/120328
PCT Pub. Date: Jul. 5, 2018

(65) Prior Publication Data
US 2018/0211626 A1  Jul. 26, 2018

(51) Int. Cl.
*G09G 3/36* (2006.01)

(52) U.S. Cl.
CPC ... *G09G 3/3677* (2013.01); *G09G 2310/0289* (2013.01); *G09G 2310/06* (2013.01); *G09G 2310/08* (2013.01)

(58) Field of Classification Search
None
See application file for complete search history.

(56) References Cited

U.S. PATENT DOCUMENTS

2016/0284294 A1* 9/2016 Dai ..................... G09G 3/3648

* cited by examiner

*Primary Examiner* — Kenneth B Lee, Jr.
(74) *Attorney, Agent, or Firm* — Andrew C. Chang

(57) ABSTRACT

The present disclosure relates to a driving method and a driving unit of GOA circuits. The driving unit includes a timing control chip and a GOA circuit including a plurality of cascaded GOA driving units. The timing control chip inputs first clock signals, second clock signals, and a constant-voltage potential to the GOA driving units at each of levels to drive the GOA driving units to output the scanning driving signals level-by-level, wherein scanning initial signals are further inputted to the GOA driving units at the first through the fourth level. The first clock signals and the second clock signals are two different clock signals selected from one clock signals set including eight high-frequency clock signals ($CK_1 \sim CK_8$), wherein $CK_m$ and $CK_{m+4}$ are inverting signals. A period of each of the high-frequency clock signals is T, and a high-potential pulse width within the period (T) is $T_1$ During a scanning driving process of each of frames, the high-potential pulse width of the high-frequency clock signals ($CK_m$) is $T_{1m}$, $T_{1m} < T_1$, m=1, 2, 3, and 4.

20 Claims, 2 Drawing Sheets

DRIVING METHODS AND DRIVING DEVICES OF GATE DRIVER ON ARRAY (GOA) CIRCUIT

BACKGROUND OF THE INVENTION

1. Field of the Invention

The present disclosure relates to display driving technology, and more particularly to a driving method and a driving device of GOA circuits.

2. Discussion of the Related Art

Flat display is characterized by attributes such as thin, power-saving, and no radiation, and thus has been widely adopted. Currently, flat display mainly includes Liquid Crystal Display (LCD) and Organic Light Emitting Display (OLED).

With respect to active LCDs, each of the pixels includes a thin film transistor (TFT), a gate (Gate) of the TFT connects to a horizontal scanning line, a drain of the TFT connects to a vertical data line, and a source of the TFT connects to a pixel electrode. When the horizontal scanning line is applied with an enough voltage, the TFTs on the scanning line are turned on. At this moment, the pixel electrode on the horizontal scanning lines connects with the vertical data line to write the display signals on the data line to the pixel so as to control the display performance by controlling the transmittance of the liquid crystals. Currently, the horizontal scanning line of LCDs is mainly driven by an external IC for controlling the charging and the discharging of the horizontal scanning lines in a level-by-level manner. With respect to GOA technology, the original manufacturing process of the liquid crystal panel may be adopted to manufacture the driving circuit of the horizontal scanning line on a rim of the display area such that the external IC may drive the horizontal scanning lines. The GOA technology may decrease the bonding process of the external IC so as to enhance the efficiency and to reduce the product cost. In addition, the liquid crystal panel is more appropriate for narrow-border or no-border display devices.

Conventionally, the GOA driving circuit includes a plurality cascaded-connected GOA units, and each of the GOA units drives one horizontal scanning line accordingly. The GOA circuit includes a pull-up part, a pull-up control part, a transfer part, a pull-down holding part, and a boast capacitor for pulling up the potential. The pull-up part is responsible for outputting the clock signals (Clock) to be the gate signals (Gate). The pull-up control part controls a turn-on time of the pull-up part, and connects to the transfer signals or gate signals transmitted from the GOA circuit at a preceding level. The pull-down holding part maintains the Gate output signals and holds the Gate signals of the pull-up part, which is referred to as the Q node) in an off state, i.e., a low level potential. The C boast conducts a secondary raise-up to the Q node, which contributes to the Gate signals output of the pull-up part.

Within the GOA circuit, the term "line buffer" refers to a gap between a rising edge of the scanning initial signals (STV) and the first rising edge of the data voltage signals (Data) outputted by the data driver. The longer the line buffer is, the higher the cost of the data driver circuit is, which is not beneficial to the cost reduction of the display device.

SUMMARY

To overcome the above issues, the proposed driving method and the driving device of the GOA circuit are capable of reducing the line buffer.

In one aspect, a driving method of GOA circuits, the GOA circuits includes a plurality of cascaded-connected GOA driving units, and the driving method includes: inputting first clock signals, second clock signals, and a constant-voltage potential to the GOA driving units at each of levels to drive the GOA driving units to output the scanning driving signals level-by-level, wherein scanning initial signals are further inputted to the GOA driving units at the first through the fourth level; and wherein the first clock signals and the second clock signals are two different clock signals selected from one clock signals set comprising eight high-frequency clock signals ($CK_1 \sim CK_8$), wherein $CK_m$ and $CK_{m+4}$ are inverting signals, and m=1, 2, 3, 4; the first clock signals start from the $CK_5$ to output the high-frequency clock signals cyclically, and the second clock signals starts from the $CK_1$ to output the high-frequency clock signals ($CK_1 \sim CK_8$) cyclically, wherein a period of each of the high-frequency clock signals is T, and a high-potential pulse width within the period (T) is $T_1$; and during a scanning driving process of each of frames, the high-potential pulse width of the high-frequency clock signals ($CK_m$) is $T_{1m}$, $T_{1m} < T_1$, m=1, 2, 3, and 4.

Wherein $\frac{1}{2}T_1 \leq T_{1m} < T_1$.

Wherein $T_{11} = T_{12} = T_{13} = T_{14} = \frac{1}{2}T_1$.

Wherein a first period of the high-frequency clock signals ($CK_1$) is delayed by a time period (H) of the scanning initial signals, wherein T=8H, $T_1$=3.2H.

Wherein the GOA driving units at each of the levels includes: a pull-up control circuit, a pull-up circuit, a level transfer circuit, a boast capacitor, and a pull-down holding circuit, the pull-up control circuit outputs gate control signals of the current level in accordance with the second clock signals and the transfer signals ($ST_{n-4}$), the pull-up circuit outputs the scanning driving signals of the current level in accordance with the first clock signals and the gate control signals of the current level, the pull-down holding circuit is configured for pulling down the gate control signals of the current level and the scanning driving signal of the current level to be at a low potential during a non-driving period of the GOA driving unit of the current level.

Wherein the pull-up control circuit includes a first pull-up transistor and a second pull-up transistor, the first pull-up transistor and the second pull-up transistor are connected to each other to receive the second clock signals, a source of the first pull-up transistor receives the corresponding transfer signals ($ST_{n-4}$), a drain of the first pull-up transistor connects to a source of the second pull-up transistor, a drain of the second pull-up transistor operates as an output end of the pull-up control circuit to output the gate control signals of the current level.

Wherein the pull-up circuit includes a fourth pull-up transistor, a gate of the fourth pull-up transistor connects to the output end of the pull-up control circuit to receive the gate control signals, a source of the fourth pull-up transistor receives the first clock signals, a drain of the fourth pull-up transistor operates as the output end of the pull-up circuit to output the scanning driving signal of the current level.

Wherein the level transfer circuit includes a transfer transistor, a gate of the transfer transistor connects to the output end of the pull-up control circuit to receive the gate control signals, a source of the transfer transistor connects to the first clock signals, and a drain of the transfer transistor operates as the output end of the level transfer circuit to output the scanning driving signals at the current level.

Wherein the pull-down holding circuit includes a first pull-down holding circuit and a second pull-down holding circuit for pulling down the gate control signals and the scanning driving signals to be at the low potential in an alternated manner; the first pull-down holding circuit and the second pull-down holding circuit have the same circuit structure, the first pull-down holding circuit and the second pull-down holding circuit respectively includes a first transistor, a second transistor, a third transistor, a fourth transistor, a fifth transistor, a sixth transistor, and a seventh transistor, drains of the first transistor, the second transistor, and the third transistor connect to the constant-voltage potential, gates of the first transistor, the second transistor, and the third transistor are interconnected to receive control signals, sources of the first transistor connects to the scanning driving signal; a source of the second transistor connect to the transfer signals, a source of the third transistor connects to the gate control signals, a gate and a source of the fourth transistor are connected to receive pull-down clock signals, a drain of the fourth transistor connects to a source of the fifth transistor, a gate of the fifth transistor connects to the gate control signals, a drain of the fifth transistor connects to the constant-voltage potential; a source of the sixth transistor connects to the source of the fourth transistor to receive the pull-down clock signals, a gate of the sixth transistor connects to the drain of the fourth transistor, a drain of the sixth transistor connects to a source of the seventh transistor; a gate of the seventh transistor connects to the gate control signals, and a drain of the seventh transistor connects to the constant-voltage potential, wherein the drain of the sixth transistor outputs the control signals to connect to the gates of the first transistor, the second transistor, and the third transistor; wherein the first pull-down clock signals received by the first pull-down holding circuit and the second pull-down clock signals are low frequency signals, and a high potential and the low potential of the first pull-down clock signals are respectively logically inverted from the high potential and the low potential of the second pull-down clock signals.

Wherein one end of the boast capacitor connects to the output end of the pull-up control circuit, and the other end of the boast capacitor connects to the output end of the pull-up circuit.

In another aspect, a driving unit of GOA circuits, includes: a timing control chip and a GOA circuit comprising a plurality of cascaded GOA driving units, the timing control chip inputs first clock signals, second clock signals, and a constant-voltage potential to the GOA driving units at each of levels to drive the GOA driving units to output the scanning driving signals level-by-level, wherein scanning initial signals are further inputted to the GOA driving units at the first through the fourth level; and wherein the first clock signals and the second clock signals are two different clock signals selected from one clock signals set comprising eight high-frequency clock signals ($CK_1 \sim CK_8$), wherein $CK_m$ and $CK_{m+4}$ are inverting signals, and m=1, 2, 3, 4; the first clock signals start from the $CK_5$ to output the high-frequency clock signals cyclically, and the second clock signals starts from the $CK_1$ to output the high-frequency clock signals ($CK_1 \sim CK_8$) cyclically, wherein a period of each of the high-frequency clock signals is T, and a high-potential pulse width within the period (T) is $T_1$; and during a scanning driving process of each of frames, the high-potential pulse width of the high-frequency clock signals ($CK_m$) is $T_{1m}$, $T_{1m} < T_1$, m=1, 2, 3, and 4.

Wherein $\frac{1}{2}T_1 \le T_{1m} < T_1$.

Wherein $T_{11} = T_{12} = T_{13} = T_{14} = \frac{1}{2}T_1$.

Wherein a first period of the high-frequency clock signals ($CK_1$) is delayed by a time period (H) of the scanning initial signals, wherein T=8H, $T_1$=3.2H.

Wherein the GOA driving units at each of the levels includes: a pull-up control circuit, a pull-up circuit, a level transfer circuit, a boast capacitor, and a pull-down holding circuit, the pull-up control circuit outputs gate control signals of the current level in accordance with the second clock signals and the transfer signals ($ST_{n-4}$), the pull-up circuit outputs the scanning driving signals of the current level in accordance with the first clock signals and the gate control signals of the current level, the pull-down holding circuit is configured for pulling down the gate control signals of the current level and the scanning driving signal of the current level to be at a low potential during a non-driving period of the GOA driving unit of the current level.

Wherein the pull-up control circuit includes a first pull-up transistor and a second pull-up transistor, the first pull-up transistor and the second pull-up transistor are connected to each other to receive the second clock signals, a source of the first pull-up transistor receives the corresponding transfer signals ($ST_{n-4}$), a drain of the first pull-up transistor connects to a source of the second pull-up transistor, a drain of the second pull-up transistor operates as an output end of the pull-up control circuit to output the gate control signals of the current level.

Wherein the pull-up circuit includes a fourth pull-up transistor, a gate of the fourth pull-up transistor connects to the output end of the pull-up control circuit to receive the gate control signals, a source of the fourth pull-up transistor receives the first clock signals, a drain of the fourth pull-up transistor operates as the output end of the pull-up circuit to output the scanning driving signal of the current level.

Wherein the level transfer circuit includes a transfer transistor, a gate of the transfer transistor connects to the output end of the pull-up control circuit to receive the gate control signals, a source of the transfer transistor connects to the first clock signals, and a drain of the transfer transistor operates as the output end of the level transfer circuit to output the scanning driving signals at the current level.

Wherein the pull-down holding circuit includes a first pull-down holding circuit and a second pull-down holding circuit for pulling down the gate control signals and the scanning driving signals to be at the low potential in an alternated manner; the first pull-down holding circuit and the second pull-down holding circuit have the same circuit structure, the first pull-down holding circuit and the second pull-down holding circuit respectively includes a first transistor, a second transistor, a third transistor, a fourth transistor, a fifth transistor, a sixth transistor, and a seventh transistor, drains of the first transistor, the second transistor, and the third transistor connect to the constant-voltage potential, gates of the first transistor, the second transistor, and the third transistor are interconnected to receive control signals, sources of the first transistor connects to the scanning driving signal; a source of the second transistor connect to the transfer signals, a source of the third transistor connects to the gate control signals, a gate and a source of the fourth transistor are connected to receive pull-down clock signals, a drain of the fourth transistor connects to a source of the fifth transistor, a gate of the fifth transistor connects to the gate control signals, a drain of the fifth transistor connects to the constant-voltage potential; a source of the sixth transistor connects to the source of the fourth transistor to receive the pull-down clock signals, a gate of the sixth transistor connects to the drain of the fourth transistor, a drain of the sixth transistor connects to a source of the seventh transistor; a gate of the seventh transistor connects to the gate control signals, and a drain of the seventh transistor connects to the constant-voltage potential, wherein the drain of the sixth transistor outputs the control signals to connect to the gates of the first transistor, the second transistor, and the third transistor; wherein the first pull-down clock signals received by the first pull-down holding circuit and the second pull-down clock signals are low frequency signals, and a high potential and the low potential of the first pull-down clock signals are respectively logically inverted from the high potential and the low potential of the second pull-down clock signals.

Wherein one end of the boast capacitor connects to the output end of the pull-up control circuit, and the other end of the boast capacitor connects to the output end of the pull-up circuit.

In view of the above, the driving method and the driving device adopts the GOA circuit driven by eight high-frequency clock signals. When each of the frames are driven, the high-potential pulse width of the first period of the first through the fourth clock signals ($CK_1$~$CK_4$) is smaller, and the output of the scanning driving signals of the GOA driving unit at the first level is accelerated, which reduces the gap between the rising edge of the scanning initial signals (STV) and the first rising edge of the data voltage signals (Date). Thus, the proposed solution reduces the line buffer during an initial driving phase, which contributes the cost down of the driving circuit.

DETAILED DESCRIPTION OF THE EMBODIMENTS

Figure 1:
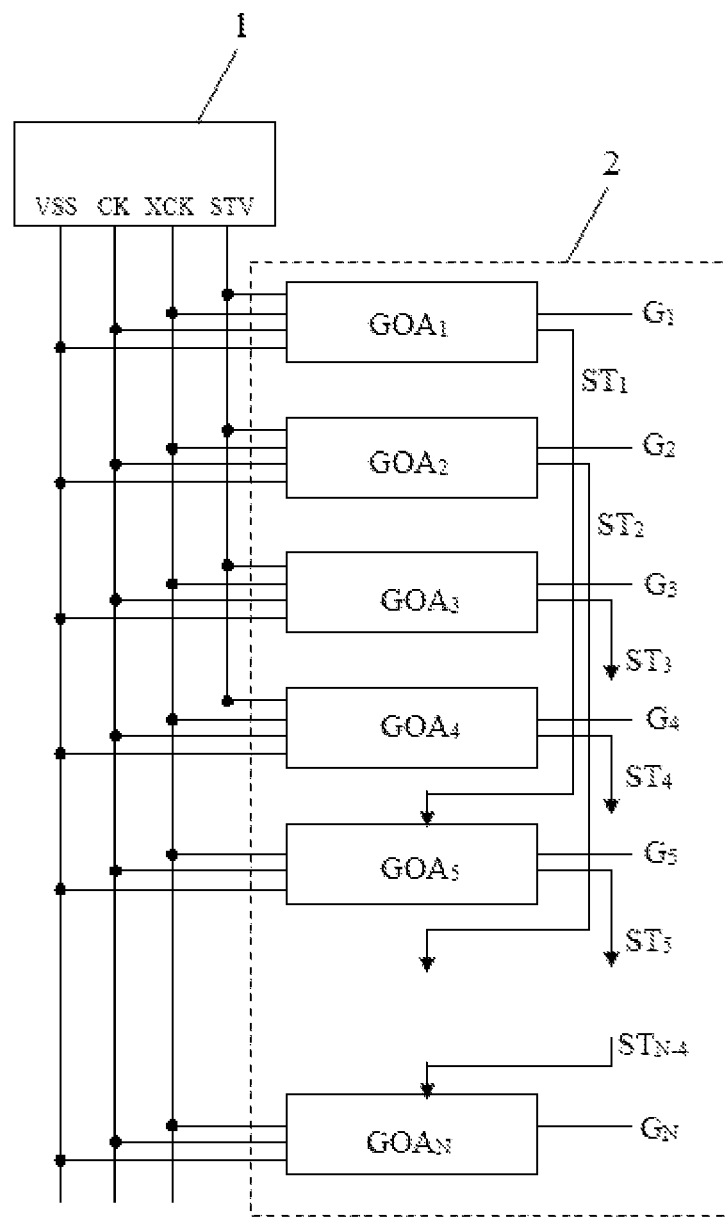
FIG. 1 is a schematic view of the driving device of the GOA circuit in accordance with one embodiment.

Embodiments of the invention will now be described more fully hereinafter with reference to the accompanying drawings, in which embodiments of the invention are shown.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

The driving device of the GOA circuit, as shown in FIG. 1, includes a timing control chip (Tcon) 1 and a GOA circuit 2. The GOA circuit 2 includes a plurality of cascaded-connected GOA driving units ($GOA_1$~$GOA_N$), and the Tcon 1 inputs first clock signals (CK), second clock signals (XCK), and a constant-voltage potential (VSS) to each the GOA driving units ($GOA_1$~$GOA_N$) at each of the levels to drive the GOA driving units ($GOA_1$~$GOA_N$) to output the scanning driving signals ($G_1$~$G_N$) level-by-level to the display panel, wherein the Tcon 1 further inputs the scanning initial signals (STV) to the GOA driving units ($GOA_1$~$GOA_4$) at the first level through the fourth level.

Figure 2:
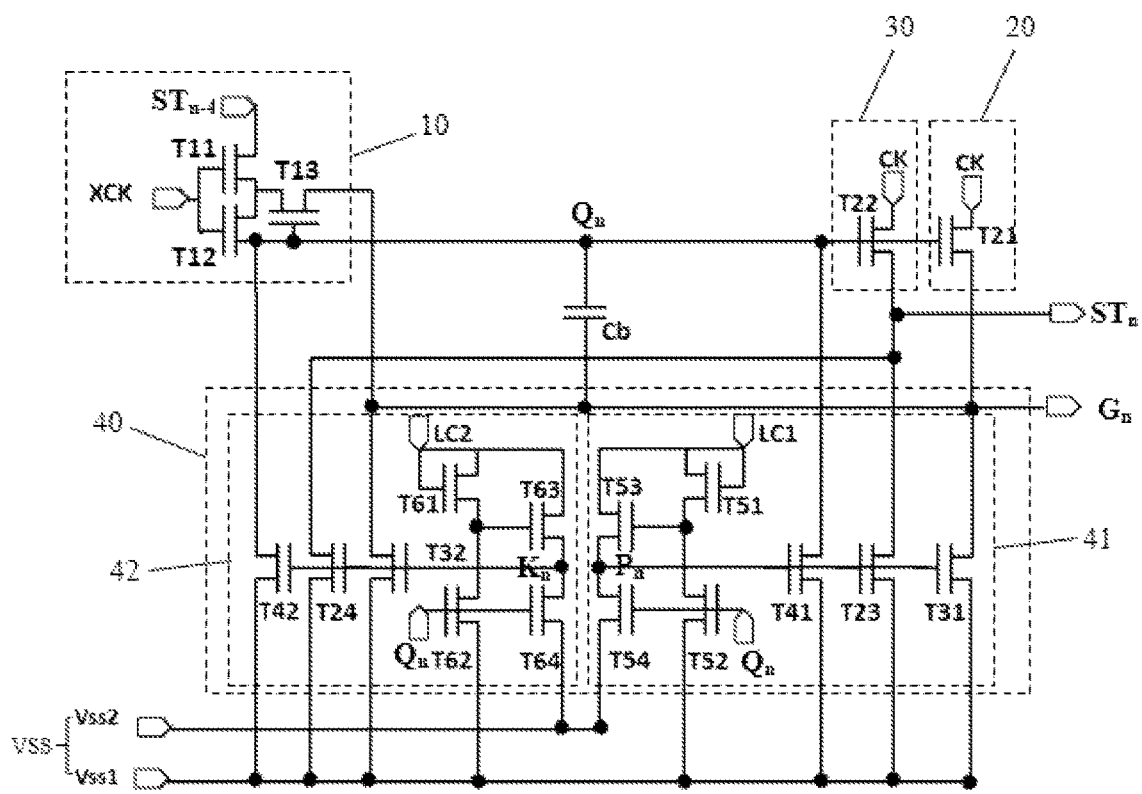
FIG. 2 is a circuit diagram of the GOA driving unit in accordance with one embodiment.

As shown in FIG. 2, in the embodiment, each of the GOA driving units includes a pull-up control circuit 10, a pull-up circuit 20, a level transfer circuit 30, a boast capacitor (Cb), and a pull-down holding circuit 40. The pull-up control circuit 10 outputs the gate control signals ($Q_n$) of the current level in accordance with the second clock signals (XCK) and the transfer signals (($ST_{n-4}$)). The pull-up circuit 20 outputs the scanning driving signals ($G_n$) of the current level in accordance with the first clock signals (CK) and the gate control signals ($Q_n$) of the current level, the level transfer circuit 30 outputs the transfer signals ($ST_n$) in accordance with the first clock signals (CK) and the gate control signals ($Q_n$) of the current level, the pull-down holding circuit 40 is configured for pulling down the gate control signals ($Q_n$) of the current level and the scanning driving signal ($G_n$) of the current level to the low level, i.e., the constant-voltage potential (VSS), during the non-driving period of the GOA driving unit of the current level. It is to be noted that when n−4 is smaller than zero, $ST_{n-4}$ does not exist, and the scanning initial signals (STV) provided by the Tcon 1 is adopted.

Specifically, as shown in FIG. 2, the pull-up control circuit 10 includes an eleventh pull-up transistor (T11) and a twelfth pull-up transistor (T12), and gates of the eleventh pull-up transistor (T11) and the twelfth pull-up transistor (T12) are connected to each other to receive the second clock signals (XCK), the source of the eleventh pull-up transistor (T11) receives the corresponding transfer signals ($ST_{n-4}$), a drain of the eleventh pull-up transistor (T11) connects to the source of the twelfth pull-up transistor (T12), the drain of the twelfth pull-up transistor (T12) operates as an output end of the pull-up control circuit 10 to output the gate control signals ($Q_n$) of the current level. In addition, as shown in FIG. 2, in order to make the circuit more stable, the pull-up control circuit 10 further includes a thirteenth pull-up transistor (T13), a gate of the thirteenth pull-up transistor (T13) connects to the drain of the twelfth pull-up transistor (T12), the source of the thirteenth pull-up transistor (T13) connects to the drain of the eleventh pull-up transistor (T11), the gate of the thirteenth pull-up transistor (T13) connects to the output end of the pull-up circuit 20. It is to be noted that when the thirteenth pull-up transistor (T13) is turned on, the resistance between the source and the drain are very huge, and the current is very small, and the resistance and the current are configured such that the potential of the output end of the pull-up circuit 20 are not affected.

As shown in FIG. 2, the pull-up circuit 20 includes a fourth pull-up transistor (T21), a gate of the fourth pull-up transistor (T21) connects to the output end of the tenth controllable transistor (T10) to receive the gate control signals ($Q_n$), a source of the fourth pull-up transistor (T21) receives the first clock signals (CK), a drain of the fourth pull-up transistor (T21) operates as the output end of the pull-up circuit 20 to output the scanning driving signal ($G_n$) of the current level.

As shown in FIG. 2, the boast capacitor (Cb) connects between the output end of the pull-up control circuit 10 and the output end of the pull-up circuit 20. That is, two ends of the boast capacitor (Cb) respectively connects to the gate control signals ($Q_n$) and the scanning driving signal ($G_n$). The boast capacitor (Cb) stores the voltage of the gate of the fourth pull-up transistor (T21) when the gate control signals ($Q_n$) are at the high level. The boast capacitor (Cb) may further raise the potential of the gate of the fourth pull-up transistor (T21) such that the fourth pull-up transistor (T21) may be reliably turned on to output the scanning driving signals.

Specifically, as shown in FIG. 2, the level transfer circuit 30 includes a transfer transistor (T22), a gate of the transfer transistor (T22) connects to the output end of the pull-up control circuit 10 to receive the gate control signals ($Q_n$), a source of the transfer transistor (T22) connects to the first clock signals (CK), a drain of the transfer transistor (T22) operates as the output end of the level transfer circuit 30 to output the transfer signals ($ST_n$). The transfer signals ($ST_{n-4}$) are configured to control the pull-up control circuits for the four levels behind by the transfer signals. This control is not conducted by the scanning driving signals such that the scanning driving signals may be more reliable.

The pull-down holding circuit 40 is configured to pull down the potential of some major nodes, including the gate control signals ($Q_n$), the scanning driving signal ($G_n$), and the scanning driving signals (ST), to be at the low level when the GOA driving unit is in non-outputting timing. In the embodiment, the pull-down holding circuit 40 includes a first pull-down holding circuit 41 and a second pull-down holding circuit 42. The first pull-down holding circuit 41 and the second pull-down holding circuit 42 connects the gate control signals ($Q_n$), the scanning driving signal ($G_n$), and the transfer signals ($ST_n$) to the constant-voltage potential (VSS) in an alternated manner so as to keep the signals to be at the low potential.

Specifically, as shown in FIG. 2, the first pull-down holding circuit 41 and the second pull-down holding circuit 42 have the same circuit structure. The first pull-down holding circuit 41 and the second pull-down holding circuit 42 respectively includes a first transistor (T31, T32), a second transistor (T23, T24), a third transistor (T41, T42), a fourth transistor (T51, T61), a fifth transistor (T52, T62), a sixth transistor (T53, T63), and a seventh transistor (T54, T64), wherein drains of the first transistor (T31, T32), the second transistor (T23, T24), and the third transistor (T41, T42) connect to the constant-voltage potential (VSS), gates of the first transistor (T31, T32), the second transistor (T23, T24), and the third transistor (T41, T42) are interconnected to receive control signals ($P_n$, $K_n$), sources of the first transistor (T31, T32) connects to the scanning driving signal ($G_n$), a source of the second transistor (T23, T24) connect to the transfer signals ($ST_n$), a source of the third transistor (T41, T42) connects to the gate control signals ($Q_n$), a gate and a source of the fourth transistor (T51, T61) are connected to receive pull-down clock signals (LC1, LC2), a drain of the fourth transistor (T51, T61) connects to a source of the fifth transistor (T52, T62), a gate of the fifth transistor (T52, T62) connects to the gate control signals ($Q_n$), a drain of the fifth transistor (T52, T62) connects to the constant-voltage potential (VSS); a source of the sixth transistor (T53, T63) connects to the source of the fourth transistor (T51, T61) to receive the pull-down clock signals (LC1, LC2), a gate of the sixth transistor (T53, T63) connects to the drain of the fourth transistor (T51, T61), a drain of the sixth transistor (T53, T63) connects to a source of the seventh transistor (T54, T64); a gate of the seventh transistor (T54, T64) connects to the gate control signals ($Q_n$), and a drain of the seventh transistor (T54, T64) connects to the constant-voltage potential (VSS), wherein the drain of the sixth transistor (T53, T63) outputs the control signals ($P_n$, $K_n$) to connect to the gates of the first transistor (T31, T32), the second transistor (T23, T24), and the third transistor (T41, T42).

Wherein the first pull-down clock signals (LC1) received by the first pull-down holding circuit 41 and the second pull-down clock signals (LC2) are low frequency signals, and the high potential and the low potential of the first pull-down clock signals (LC1) are respectively logically inverted from the high potential and the low potential of the second pull-down clock signals (LC2). That is, when the first pull-down clock signals (LC1) are at the high level, the second pull-down clock signals (LC2) are at the low level. When the first pull-down clock signals (LC1) are at the low level, the second pull-down clock signals (LC2) are at the high level.

Further, in the embodiment, as shown in FIG. 2, in order to make the circuit more stable, the constant-voltage potential (VSS) includes first reference low-potential signals (Vss1) and second reference low-potential signals (Vss2), the drains of the first transistor (T31, T32), the second transistor (T23, T24), and the third transistor (T41, T42) respectively connect to the first reference low-potential signals (Vss1), the drain of the fifth transistor (T52, T62) connects to the first reference low-potential signals (Vss1), the drain of the seventh transistor (T54, T64) connects to the second reference low-potential signals (Vss2), wherein the potential of the first reference low-potential signals (Vss1) is lower than the potential of the second reference low-potential signals (Vss2).

The driving device of the GOA circuit may be driven as below:

(1) In an example, when the first pull-down clock signals (LC1) and the second pull-down clock signals (LC2) are at the low level, before being transmitted to the GOA driving unit at the n-th level, the control signals ($P_n$, $K_n$) are at the low level, the first pull-down holding circuit 41 maintains the voltage of each of the nodes. The gate control signals ($Q_n$), the scanning driving signal ($G_n$), and the transfer signals ($ST_n$) of the GOA driving unit at the n-th level are pulled down to the reference low-potential signals.

(2) Before being transmitted to the GOA driving unit at the n-th level, the second clock signals (XCK) and the corresponding transfer signals ($ST_{n-4}$) at the (n−4)-th level are at the high level, the node ($Q_n$) is at the high level, the fourth pull-up transistor (T21) is turned on; as the first clock signals (CK) are opposite to the second clock signals (XCK), that is, the first clock signals (CK) are at the low level, the scanning driving signal ($G_n$) are at the low level. As the node ($Q_n$) is at the high level, the control signals ($P_n$) are pulled down to be at the low level, the connections between the gate control signals ($Q_n$), the scanning driving signal ($G_n$), and the transfer signals ($ST_n$) of the GOA driving unit at the n-th level and the reference low-potential signals are cut off.

(3) before the first clock signals (CK) and the second clock signals (XCK) enter into the next timing sequence, the second clock signals (XCK) and the corresponding transfer signals ($ST_{n-4}$) at the (n−4)-th level are at the low level. Due to the boast capacitor (Cb), the node ($Q_n$) is at the high level. The control signals ($P_n$) stay at the low level, and the fourth pull-up transistor (T21) is in the on-state. At this moment, the first clock signals (CK) are opposite to the second clock signals (XCK), that is, the first clock signals (CK) are at the high level. The scanning driving signal ($G_n$) outputs the high level to scan the corresponding row. The transfer signals ($ST_n$) may be the high level.

(4) The first clock signals (CK) and the second clock signals (XCK) enter into the next timing sequence. The second clock signals (XCK) are at the high level, and the transfer signals ($ST_{n-4}$) are at the low level, the node ($Q_n$) transits to the low level, the first clock signals (CK) are at the low level, the scanning driving signal ($G_n$) are at the low level to scan the corresponding row. As the node ($Q_n$) is at the low level, the control signals ($P_n$) transits to the high level, the connections between the gate control signals ($Q_n$), the scanning driving signal ($G_n$), and the transfer signals ($ST_n$) of the GOA driving unit at the n-th level are pulled down to the reference low-potential signals again so as to be at the low level and to be in the off state.

Figure 3:
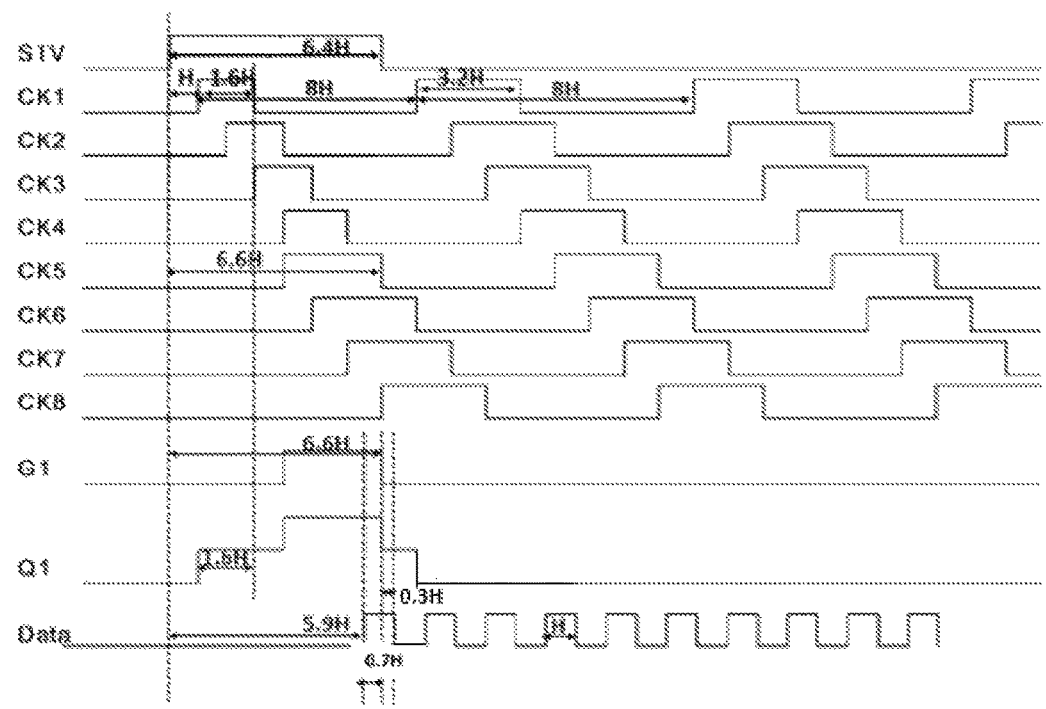
FIG. 3 is a waveform diagram of the driving method of the GOA circuit in accordance with one embodiment.

Referring to the waveform diagram in FIG. 3, the first clock signals (CK) and the second clock signals (XCK) are two different clock signals selected from one clock signals set, including eight high-frequency clock signals (CK$_1$~CK$_8$), wherein CK$_m$ and CK$_{m+4}$ are inverting signals, and m=1, 2, 3, 4. Specifically, CK$_1$ and CK$_5$ are inverting signals, CK$_2$ and CK$_6$ are inverting signals, CK$_3$ and CK$_7$ are inverting signals, and CK$_4$ and CK8 are inverting signals. The first clock signals (CK) starts from the CK$_5$ to output the high-frequency clock signals (CK$_1$~CK$_8$) cyclically, and the second clock signals (XCK) starts from the CK$_1$ to output the high-frequency clock signals (CK$_1$~CK$_8$) cyclically. For instance, with respect to the GOA driving unit at the first level, the second clock signals (XCK) received by the pull-up control circuit 10 are the CK$_1$, and the first clock signals (CK) received by the pull-up circuit 20 is the CK$_5$. Further, with respect to the GOA driving unit at the first level, there is no transfer signals (ST$_{n-4}$), and the scanning initial signals (STV) have to be inputted. The driving units at the second through the fourth GOA driving units also have similar scenarios.

With respect to the eight high-frequency clock signals (CK$_1$~CK$_8$), a period of each of the high-frequency clock signals is T, and a high-potential pulse width within the T is T$_1$.

As shown in FIG. 3, in the embodiment, in order to reduce the line buffer, within the scanning driving process of each of the frames: the high-potential pulse width of the high-frequency clock signals (CK$_m$) is T$_{1m}$, T$_{1m}$<T$_1$, m=1, 2, 3, and 4. That is, the high-potential pulse width of the high-frequency clock signals (CK$_1$~CK$_4$) are reduced such that the voltage of the Q node of the GOA driving unit at the first level may quickly climb up. As such, the output of the scanning driving signals (G$_1$) of the GOA driving unit at the first level is accelerated, which decrease the gap between the rising edge of the scanning initial signals (STV) and the first rising edge of the data voltage signals (Date).

Wherein, the first period of the high-potential pulse width (T$_{1m}$) is, preferably, not smaller than half of the pulse width of the normal period, i.e., the periods after the second periods, that is, ½T$_1$≤T$_{1m}$<T$_1$.

In the embodiment, T$_{1m}$(m=1, 2, 3, 4) is configured as T$_{11}$=T$_{12}$=T$_{13}$=T$_{14}$=½T$_1$.

Specifically, referring to FIG. 3, the first period of the high-frequency clock signals (CK$_1$) is delayed by H of the scanning initial signals (STV), wherein the period of the high-frequency clock signals T=8H, and the pulse width T$_1$=3.2H.

In the above embodiment, the T$_{1m}$ (m=1, 2, 3, 4) is configured as T$_{11}$=T$_{12}$=T$_{13}$=T$_{14}$=½T$_1$, the gap between the rising edge of the scanning initial signals (STV) and the first rising edge of the data voltage signals (Date) is reduced to be 5.9H. Compared with the conventional driving method, i.e., the gap is 7.5H. Thus, the driving method and the driving device of the GOA circuit reduces the line buffer during an initial driving phase, which contributes the cost down of the driving circuit.

In view of the above, the driving method and the driving device adopts the GOA circuit driven by eight high-frequency clock signals. When each of the frames are driven, the high-potential pulse width of the first period of the first through the fourth clock signals (CK$_1$~CK$_4$) is smaller, and the output of the scanning driving signals of the GOA driving unit at the first level is accelerated, which reduces the gap between the rising edge of the scanning initial signals (STV) and the first rising edge of the data voltage signals (Date). Thus, the proposed solution reduces the line buffer during an initial driving phase, which contributes the cost down of the driving circuit.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A driving method of GOA circuits, the GOA circuits comprises a plurality of cascaded-connected GOA driving units, and the driving method comprising:
   inputting first clock signals, second clock signals, and a constant-voltage potential to the GOA driving units at each of levels to drive the GOA driving units to output the scanning driving signals level-by-level, wherein scanning initial signals are further inputted to the GOA driving units at the first through the fourth level; and
   wherein the first clock signals and the second clock signals are two different clock signals selected from one clock signals set comprising eight high-frequency clock signals (CK$_1$~CK$_8$), wherein CK$_m$ and CK$_{m+4}$ are inverting signals, and m=1, 2, 3, 4;
   the first clock signals start from the CK$_5$ to output the high-frequency clock signals cyclically, and the second clock signals starts from the CK$_1$ to output the high-frequency clock signals (CK$_1$~CK$_8$) cyclically, wherein a period of each of the high-frequency clock signals is T, and a high-potential pulse width within the period (T) is T$_1$; and
   during a scanning driving process of each of frames, the high-potential pulse width of the high-frequency clock signals (CK$_m$) is T$_{1m}$, T$_{1m}$<T$_1$, m=1, 2, 3, and 4.

2. The driving method as claimed in claim 1, wherein ½T$_1$≤T$_{1m}$<T$_1$.

3. The driving method as claimed in claim 1, wherein T$_{11}$=T$_{12}$=T$_{13}$=T$_{14}$=½T$_1$.

4. The driving method as claimed in claim 3, wherein a first period of the high-frequency clock signals (CK$_1$) is delayed by a time period (H) of the scanning initial signals, wherein T=8H, T$_1$=3.2H.

5. The driving method as claimed in claim 4, wherein the GOA driving units at each of the levels comprises:
   a pull-up control circuit, a pull-up circuit, a level transfer circuit, a boost capacitor, and a pull-down holding circuit,
   the pull-up control circuit outputs gate control signals of the current level in accordance with the second clock signals and the transfer signals (ST$_{n-4}$), the pull-up circuit outputs the scanning driving signals of the current level in accordance with the first clock signals and the gate control signals of the current level, the pull-down holding circuit is configured for pulling down the gate control signals of the current level and the scanning driving signal of the current level to be at a low potential during a non-driving period of the GOA driving unit of the current level.

6. The driving method as claimed in claim 5, wherein the pull-up control circuit comprises a first pull-up transistor and a second pull-up transistor, the first pull-up transistor and the second pull-up transistor are connected to each other to receive the second clock signals, a source of the first pull-up transistor receives the corresponding transfer signals ($ST_{n-4}$), a drain of the first pull-up transistor connects to a source of the second pull-up transistor, a drain of the second pull-up transistor operates as an output end of the pull-up control circuit to output the gate control signals of the current level.

7. The driving method as claimed in claim 5, wherein the pull-up circuit comprises a fourth pull-up transistor, a gate of the fourth pull-up transistor connects to the output end of the pull-up control circuit to receive the gate control signals, a source of the fourth pull-up transistor receives the first clock signals, a drain of the fourth pull-up transistor operates as the output end of the pull-up circuit to output the scanning driving signal of the current level.

8. The driving method as claimed in claim 5, wherein the level transfer circuit comprises a transfer transistor, a gate of the transfer transistor connects to the output end of the pull-up control circuit to receive the gate control signals, a source of the transfer transistor connects to the first clock signals, and a drain of the transfer transistor operates as the output end of the level transfer circuit to output the scanning driving signals at the current level.

9. The driving method as claimed in claim 5, wherein the pull-down holding circuit comprises a first pull-down holding circuit and a second pull-down holding circuit for pulling down the gate control signals and the scanning driving signals to be at the low potential in an alternated manner;

the first pull-down holding circuit and the second pull-down holding circuit have the same circuit structure, the first pull-down holding circuit and the second pull-down holding circuit respectively includes a first transistor, a second transistor, a third transistor, a fourth transistor, a fifth transistor, a sixth transistor, and a seventh transistor, drains of the first transistor, the second transistor, and the third transistor connect to the constant-voltage potential, gates of the first transistor, the second transistor, and the third transistor are interconnected to receive control signals, sources of the first transistor connects to the scanning driving signal;

a source of the second transistor connect to the transfer signals, a source of the third transistor connects to the gate control signals, a gate and a source of the fourth transistor are connected to receive pull-down clock signals, a drain of the fourth transistor connects to a source of the fifth transistor, a gate of the fifth transistor connects to the gate control signals, a drain of the fifth transistor connects to the constant-voltage potential;

a source of the sixth transistor connects to the source of the fourth transistor to receive the pull-down clock signals, a gate of the sixth transistor connects to the drain of the fourth transistor, a drain of the sixth transistor connects to a source of the seventh transistor; a gate of the seventh transistor connects to the gate control signals, and a drain of the seventh transistor connects to the constant-voltage potential, wherein the drain of the sixth transistor outputs the control signals to connect to the gates of the first transistor, the second transistor, and the third transistor;

wherein the first pull-down clock signals received by the first pull-down holding circuit and the second pull-down clock signals are low frequency signals, and a high potential and the low potential of the first pull-down clock signals are respectively logically inverted from the high potential and the low potential of the second pull-down clock signals.

10. The driving method as claimed in claim 5, wherein one end of the boast capacitor connects to the output end of the pull-up control circuit, and the other end of the boast capacitor connects to the output end of the pull-up circuit.

11. A driving unit of GOA circuits, comprising:
a timing control chip and a GOA circuit comprising a plurality of cascaded GOA driving units, the timing control chip inputs first clock signals, second clock signals, and a constant-voltage potential to the GOA driving units at each of levels to drive the GOA driving units to output the scanning driving signals level-by-level, wherein scanning initial signals are further inputted to the GOA driving units at the first through the fourth level; and wherein the first clock signals and the second clock signals are two different clock signals selected from one clock signals set comprising eight high-frequency clock signals ($CK_1$~$CK_8$), wherein $CK_m$ and $CK_{m+4}$ are inverting signals, and m=1, 2, 3, 4;

the first clock signals start from the $CK_5$ to output the high-frequency clock signals cyclically, and the second clock signals starts from the $CK_1$ to output the high-frequency clock signals ($CK_1$~$CK_8$) cyclically, wherein a period of each of the high-frequency clock signals is T, and a high-potential pulse width within the period (T) is $T_1$; and during a scanning driving process of each of frames, the high-potential pulse width of the high-frequency clock signals ($CK_m$) is $T_{1m}$, $T_{1m}$<$T_1$, m=1, 2, 3, and 4.

12. The driving unit as claimed in claim 11, wherein $2T_1$<$T_{1m}$<$T_1$.

13. The driving unit as claimed in claim 11, wherein $T_{11}$=$T_{12}$=$T_{13}$=$T_{14}$=1 $_2$ $T_1$.

14. The driving unit as claimed in claim 13, wherein a first period of the high-frequency clock signals ($CK_1$) is delayed by a time period (H) of the scanning initial signals, wherein T=8H, $T_1$=3.2H.

15. The driving unit as claimed in claim 14, wherein the GOA driving units at each of the levels comprises:
a pull-up control circuit, a pull-up circuit, a level transfer circuit, a boast capacitor, and a pull-down holding circuit, the pull-up control circuit outputs gate control signals of the current level in accordance with the second clock signals and the transfer signals ($ST_{n-4}$), the pull-up circuit outputs the scanning driving signals of the current level in accordance with the first clock signals and the gate control signals of the current level, the pull-down holding circuit is configured for pulling down the gate control signals of the current level and the scanning driving signal of the current level to be at a low potential during a non-driving period of the GOA driving unit of the current level.

16. The driving unit as claimed in claim 15, wherein the pull-up control circuit comprises a first pull-up transistor and a second pull-up transistor, the first pull-up transistor and the second pull-up transistor are connected to each other to receive the second clock signals, a source of the first pull-up transistor receives the corresponding transfer signals ($ST_{n-4}$), a drain of the first pull-up transistor connects to a source of the second pull-up transistor, a drain of the second pull-up transistor operates as an output end of the pull-up control circuit to output the gate control signals of the current level.

17. The driving unit as claimed in claim 15, wherein the pull-up circuit comprises a fourth pull-up transistor, a gate of the fourth pull-up transistor connects to the output end of the pull-up control circuit to receive the gate control signals, a source of the fourth pull-up transistor receives the first clock signals, a drain of the fourth pull-up transistor operates as the output end of the pull-up circuit to output the scanning driving signal of the current level.

18. The driving unit as claimed in claim 15, wherein the level transfer circuit comprises a transfer transistor, a gate of the transfer transistor connects to the output end of the pull-up control circuit to receive the gate control signals, a source of the transfer transistor connects to the first clock signals, and a drain of the transfer transistor operates as the output end of the level transfer circuit to output the scanning driving signals at the current level.

19. The driving unit as claimed in claim 15, wherein the pull-down holding circuit comprises a first pull-down holding circuit and a second pull-down holding circuit for pulling down the gate control signals and the scanning driving signals to be at the low potential in an alternated manner;

the first pull-down holding circuit and the second pull-down holding circuit have the same circuit structure, the first pull-down holding circuit and the second pull-down holding circuit respectively includes a first transistor, a second transistor, a third transistor, a fourth transistor, a fifth transistor, a sixth transistor, and a seventh transistor, drains of the first transistor, the second transistor, and the third transistor connect to the constant-voltage potential, gates of the first transistor, the second transistor, and the third transistor are interconnected to receive control signals, sources of the first transistor connects to the scanning driving signal;

a source of the second transistor connect to the transfer signals, a source of the third transistor connects to the gate control signals, a gate and a source of the fourth transistor are connected to receive pull-down clock signals, a drain of the fourth transistor connects to a source of the fifth transistor, a gate of the fifth transistor connects to the gate control signals, a drain of the fifth transistor connects to the constant-voltage potential;

a source of the sixth transistor connects to the source of the fourth transistor to receive the pull-down clock signals, a gate of the sixth transistor connects to the drain of the fourth transistor, a drain of the sixth transistor connects to a source of the seventh transistor; a gate of the seventh transistor connects to the gate control signals, and a drain of the seventh transistor connects to the constant-voltage potential, wherein the drain of the sixth transistor outputs the control signals to connect to the gates of the first transistor, the second transistor, and the third transistor;

wherein the first pull-down clock signals received by the first pull-down holding circuit and the second pull-down clock signals are low frequency signals, and a high potential and the low potential of the first pull-down clock signals are respectively logically inverted from the high potential and the low potential of the second pull-down clock signals.

20. The driving unit as claimed in claim 15, wherein one end of the boast capacitor connects to the output end of the pull-up control circuit, and the other end of the boast capacitor connects to the output end of the pull-up circuit.

* * * * *